(12) United States Patent
Trimberger

(10) Patent No.: US 8,024,688 B1
(45) Date of Patent: Sep. 20, 2011

(54) DETERRING REVERSE ENGINEERING

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 371 days.

(21) Appl. No.: 12/333,594

(22) Filed: Dec. 12, 2008

(51) Int. Cl.
  *G06F 17/50* (2006.01)
(52) U.S. Cl. ......... 716/117; 716/111; 716/121; 713/189
(58) Field of Classification Search .................. 716/11, 716/117, 121; 713/189
  See application file for complete search history.

(56) References Cited

U.S. PATENT DOCUMENTS

| | | | |
|---|---|---|---|
| 5,343,526 A * | 8/1994 | Lassers | 705/59 |
| 6,006,328 A * | 12/1999 | Drake | 726/23 |
| 6,216,258 B1 * | 4/2001 | Mohan et al. | 716/117 |
| 6,546,524 B1 * | 4/2003 | Chankramath et al. | 716/136 |
| 6,904,527 B1 * | 6/2005 | Parlour et al. | 713/189 |
| 6,954,907 B2 * | 10/2005 | Nakano et al. | 716/54 |
| 6,957,340 B1 * | 10/2005 | Pang et al. | 713/189 |
| 7,024,554 B1 * | 4/2006 | Nunns | 713/164 |
| 7,030,647 B1 * | 4/2006 | White et al. | 326/38 |
| 7,203,842 B2 * | 4/2007 | Kean | 713/189 |
| 7,240,218 B2 * | 7/2007 | Kean | 713/193 |
| 7,254,800 B1 * | 8/2007 | Trimberger | 716/117 |
| 7,383,519 B2 * | 6/2008 | Iwamura | 716/106 |
| 7,752,407 B1 * | 7/2010 | Langhammer et al. | 711/164 |
| 7,774,723 B2 * | 8/2010 | Banerjee | 716/119 |
| 7,809,544 B1 * | 10/2010 | Trimberger | 703/15 |
| 2001/0037458 A1 * | 11/2001 | Kean | 713/193 |
| 2002/0150252 A1 * | 10/2002 | Wong | 380/277 |
| 2002/0199110 A1 * | 12/2002 | Kean | 713/189 |
| 2004/0044514 A1 * | 3/2004 | Granny et al. | 703/23 |
| 2007/0288765 A1 * | 12/2007 | Kean | 713/193 |
| 2009/0182605 A1 * | 7/2009 | Lappas et al. | 705/8 |

* cited by examiner

*Primary Examiner* — Naum Levin
(74) *Attorney, Agent, or Firm* — W. Eric Webostad; LeRoy D. Maunu

(57) ABSTRACT

A method for detecting reverse engineering of a configuration bitstream for an integrated circuit is described. A user design is obtained. It is determined if the user design is a degenerate design. If the user design is a degenerate design, it is determined if a trip point for bitstream generation has been tripped. If the trip point for the bitstream generation has not been tripped, deterrence information is updated and the bitstream generation is allowed to take place. If the trip point for the bitstream generation has been tripped, at least one reverse engineering countermeasure is initiated.

21 Claims, 4 Drawing Sheets

DETERRING REVERSE ENGINEERING

FIELD OF THE INVENTION

The invention relates to integrated circuit devices ("ICs"). More particularly, the invention relates to deterring reverse engineering of a configuration bitstream for an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As is well known, a circuit design is compiled to run in the PLD. The compilation process converts the design as specified by a designer or programmer into the binary code that controls the PLD. For a microprocessor, the complier translates a programming language, for example the well-known "C" programming language, into microprocessor machine code. For a PLD, the design is compiled in several stages. It is synthesized, mapped, placed, and routed for providing a network list ("netlist"). Such a netlist may be provided to a bit generator, such as Bitgen, available from Xilinx, Inc., of San Jose, Calif. In response to a netlist, Bitgen generates a configuration bitstream which may be used for instantiating such circuit design in field programmable logic gates ("programmable fabric") of a PLD. The configuration bitstream, as previously indicated, may be used to program programmable fabric to implement the circuit design with field programmable logic gates.

A bit generator, such as Bitgen, may include a design rule checker ("DRC"). A DRC in the context of a bit generator is not to determine whether layout rules have been violated, but rather is to determine whether the netlist has errors with respect to programming programmable fabric. For example, if there is a circuit which has an output that is supposed to connect to another circuit but does not, such a DRC may flag this hanging connection error. Another example of a design rule violation may be a network ("net") not having a source or a net with two sources. Furthermore, there are other known types of errors to check for by use of such a DRC. A design with a design rule violation may give unpredictable results or may even damage the PLD. Therefore, in normal use, a bit generator or compiler will not create a bitstream or generate object code for a design with a DRC violation.

Compilers and bit generators may have options for unusual settings. These settings may override the safe operation of the software and generate output that may not function correctly. Optionally, a DRC of a bit generator may be forced to generate a configuration bitstream, even though one or more errors have been detected. Thus, for partial reconfiguration, when a user may be attempting to design just a portion of a circuit, such bit generator may be forced to generate this partial circuit standing alone without being connected to the overall circuit. Another option, rather than forcing bitstream generation, may be simply to turn off the DRC. Thus, designs with one or more errors may have configuration bitstreams generated for them. This may be useful in an experimental setting, where it is anticipated that errors will result from a check by a DRC. Accordingly, it should be appreciated that there are multiple uses for generating configuration bitstreams which have one or more errors as detected by such a DRC.

More recently, attempts have been made to reverse engineer configuration bitstreams. For example, a netlist may be provided to generate a bitstream that differs in a single feature from another netlist. By supplying both netlists to a bit generator and then subsequently comparing the two configuration bitstreams generated, information regarding the relationship of a configuration bitstream to a PLD may be gleaned. This tedious task of comparing configuration bitstreams in order to completely reverse engineer a PLD may take tens of thousands of bitstream generation cycles. However, with computer capabilities, such comparisons heretofore may have been performed within a reasonable time.

Unfortunately, reverse engineering in order to understand the function of each bit in a configuration bitstream may be used for unlawful pirating of a design. It should be understood that if a user is able to reverse engineer a configuration bitstream of programmable fabric, then the identity of associated circuitry of each bit becomes known. Accordingly, this may be used unlawfully or in violation of a license agreement to facilitate reverse engineering of the design of a user of a PLD.

Accordingly, it would be desirable and useful to provide means for deterring such reverse engineering of configuration bitstreams in order to deter piracy.

SUMMARY OF THE INVENTION

One or more aspects generally relate to deterring reverse engineering of a configuration bitstream for an integrated circuit.

An aspect relates generally to a method for deterring reverse engineering. A user design is obtained. It is determined if the user design is a degenerate design. If the user design is a degenerate design, it is determined if a trip point for bitstream generation has been tripped. If the trip point for the bitstream generation has not been tripped, deterrence information is updated and the bitstream generation is allowed to take place. If the trip point for the bitstream generation has been tripped, at least one reverse engineering countermeasure is initiated.

Another aspect relates generally to a method for deterring reverse engineering. User data is obtained and checked for an active force setting that causes output data to be generated regardless of any error in the user data. If the force setting is active, it is determined if a trip point for generation of the output data has been tripped. If the trip point for generation of the output data has not been tripped, generation of the output data is allowed and a counter is updated. If the trip point for generation of the output data has been tripped, at least one reverse engineering countermeasure is initiated.

Yet another aspect relates generally to a machine-readable medium having stored thereon information representing instructions that, when executed by a processor, cause the processor to perform operations including checking for a force setting being active, the force setting causing output data to be generated regardless of any error in the user data. If the force setting is active, it is determined if a trip point for generation of the output data has been tripped. If the trip point for generation of the output data has not been tripped, generation of the output data is allowed and a counter is updated. If the trip point for generation of the output data has been tripped, reverse engineering countermeasures are initiated.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
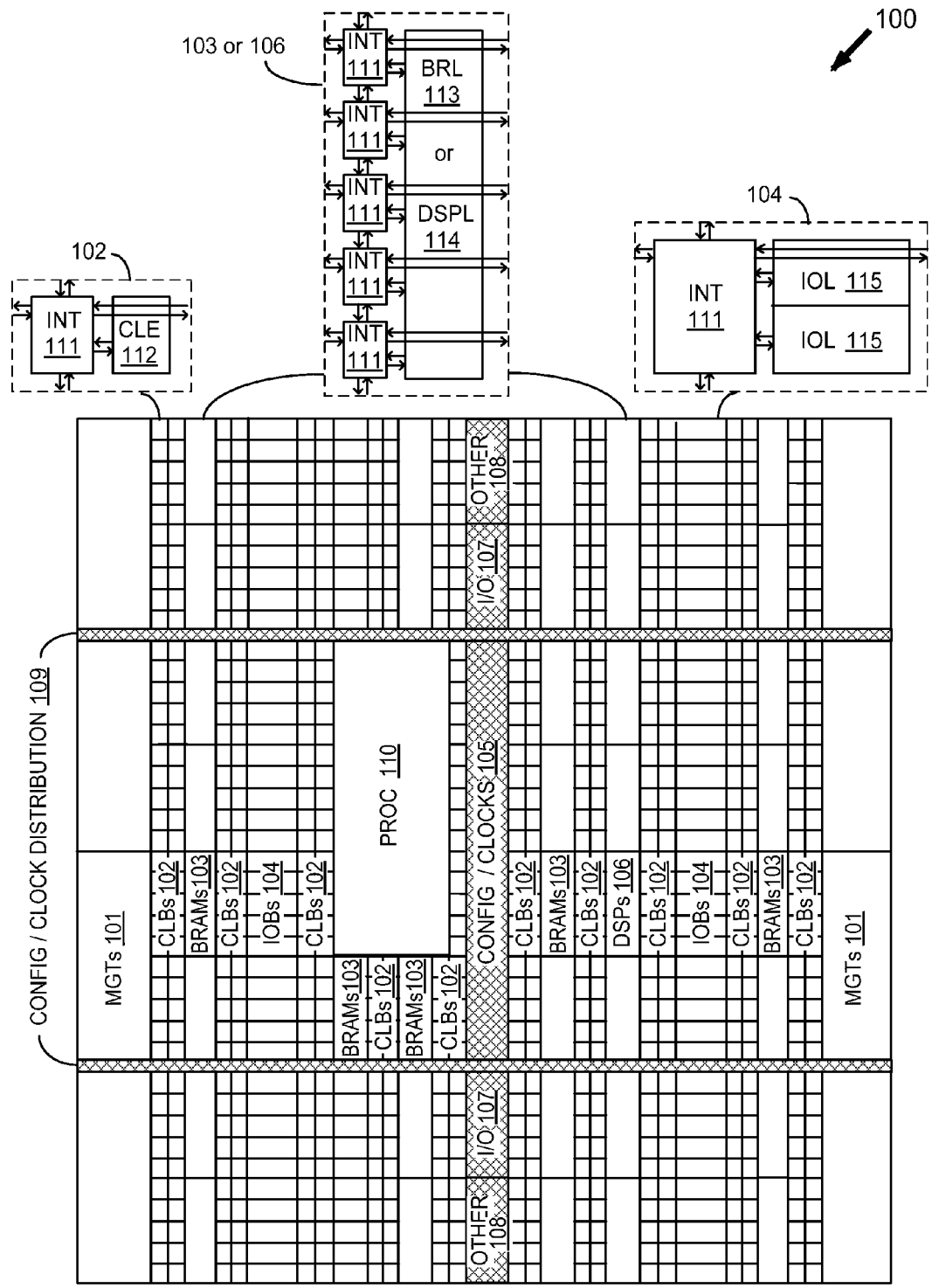
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a columnar area near the center of the die (shown in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

As previously mentioned, it would desirable and useful to deter pirating of programmable fabric. However, as also previously mentioned, there are legitimate reasons for forcing bitstream generation in the presence of one or more DRC violations or turning off a DRC entirely.

Figure 2:
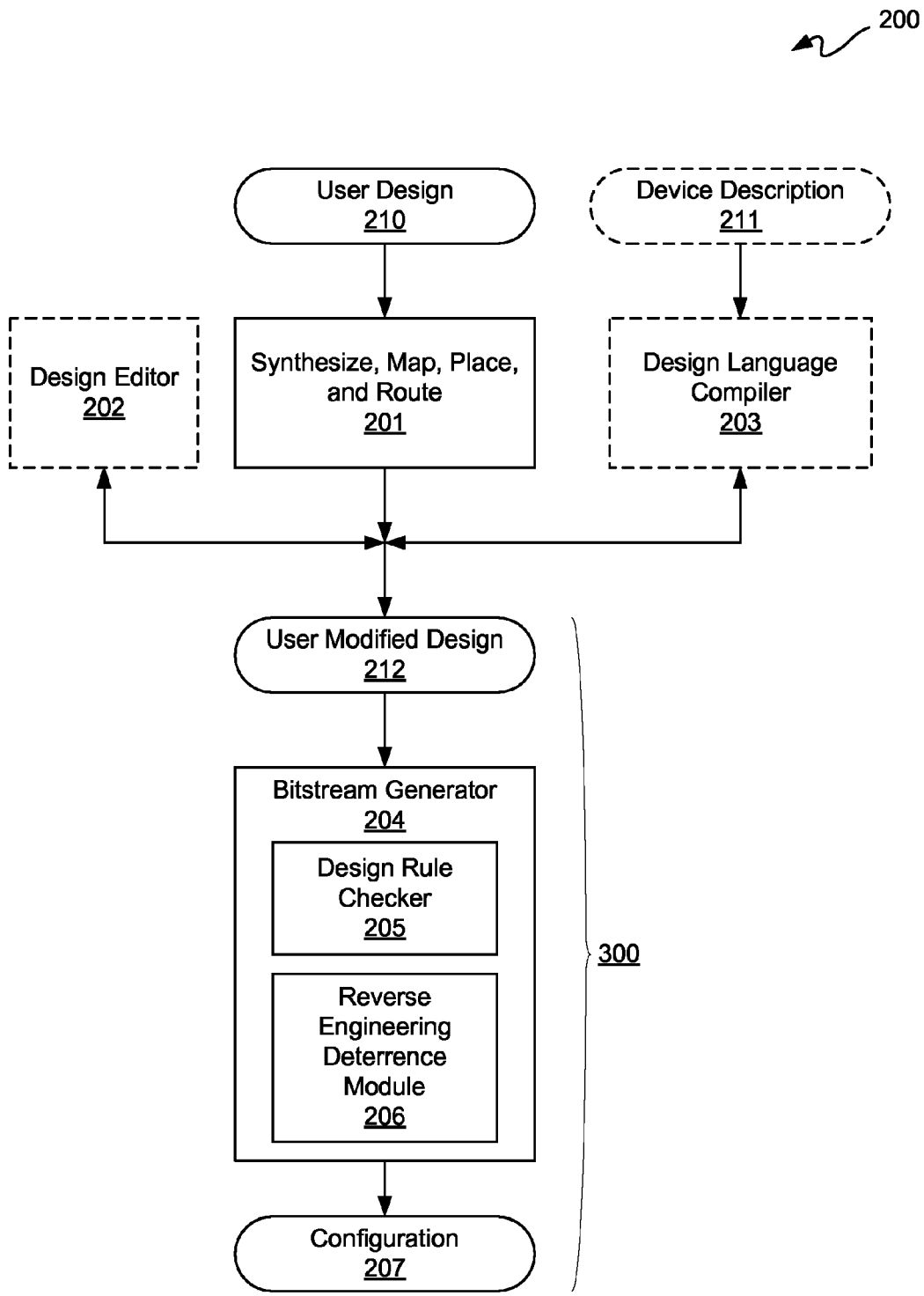
FIG. 2 is a block/flow diagram depicting a compilation flow including bit generation, in accordance with an embodiment of the present invention.

FIG. 2 is a block/flow diagram depicting an exemplary embodiment of a bit generation flow 200. At 210, a user design is provided for synthesizing, mapping, placing, and routing at 201. As block 201 is conventional, it is not described in unnecessary detail herein. The output of block 201 is conventionally a netlist. As is known, a netlist may optionally be edited after output from 201 using a design editor 202. An example of a design editor 202 is a Xilinx Design Editor available from Xilinx, Inc., of San Jose, Calif. A design editor 202 may provide a graphical design image of circuitry and allow such circuitry to be changed through a graphical interface. Alternatively, a design may be described in a textual format, such as device description 211. Such device description 211 may be provided to a design language compiler or translator 203. An example of a known design language compiler 203 is Xilinx Design Language Translator available from Xilinx, Inc., of San Jose, Calif. that uses what is known as "xdl," namely Xilinx design language. Xilinx design language is a textual format. Design language compiler 203 may obtain files from a netlist output from block 201 and change such files responsive to the textual description via device description 211. Whether by design editor 202 or design language complier 203, a netlist, or a portion or portions thereof, may be repeatedly captured for modification.

Assuming a design has been modified, either optionally by use of design editor 202 or optionally design language compiler 203, or by repeatedly providing another version of user design 210 into block 201, such a modified design 212 may be provided to a bitstream generator 204. Again, an example of a bitstream generator 204 is Bitgen available from Xilinx, Inc., of San Jose, Calif.; however, other known bit generators may be used. Bitstream generator 204 includes DRC 205 and reverse engineering deterrence module 206. Output of bitstream generator 204 may be a user modified design configuration bitstream 207. For purposes of clarity by way of example and not limitation, it shall be assumed that user modified design 212 is from any one or more of the above branches for modifying a design. Furthermore, it shall be assumed that such a modification may be performed for lawful or unlawful purposes.

Figure 3:
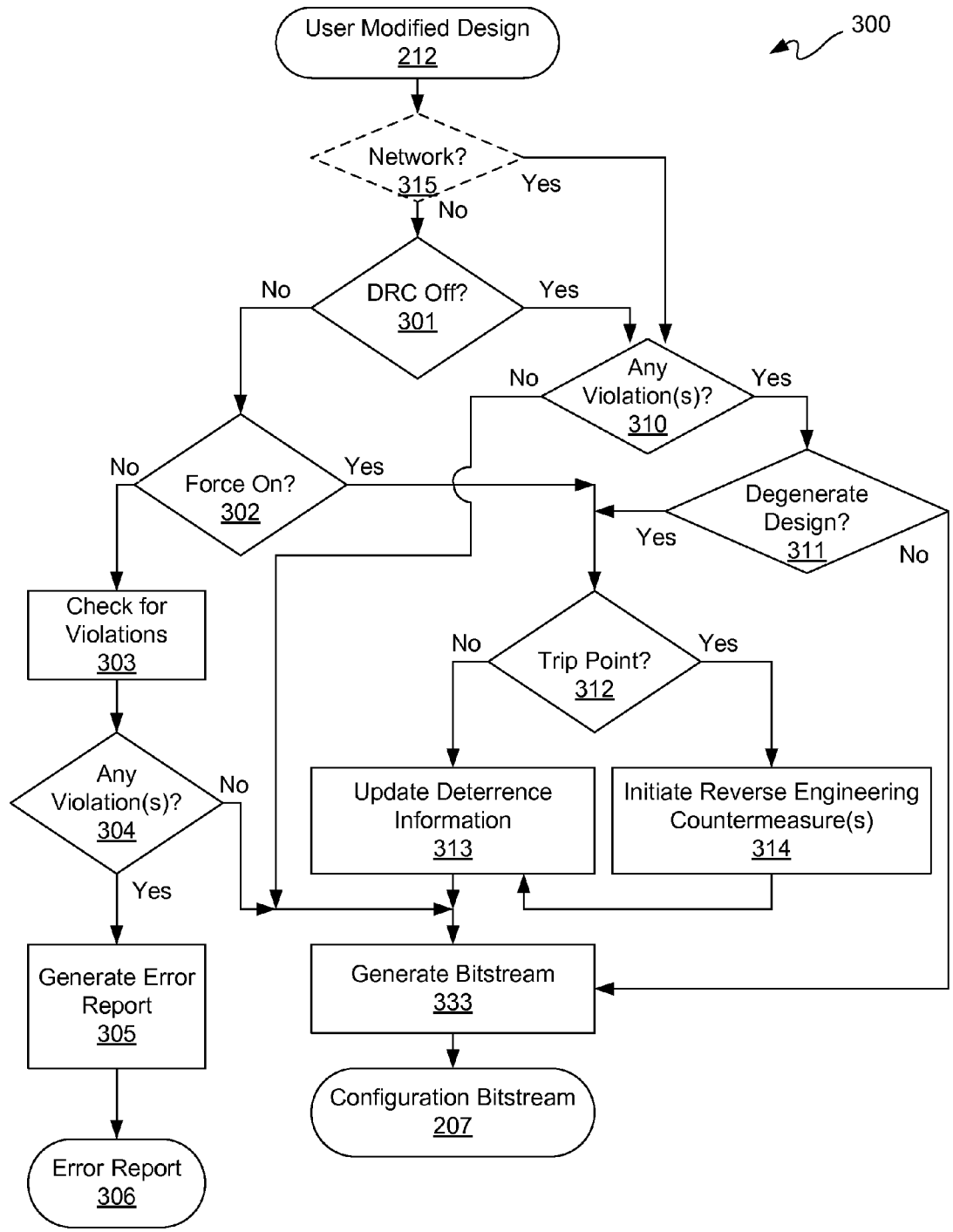
FIG. 3 is flow diagram depicting an exemplary embodiment of a portion of the bit generation flow of FIG. 2.

FIG. 3 is flow diagram depicting an exemplary embodiment of portion 300 of flow 200 of FIG. 2. With simultaneous reference to FIGS. 2 and 3, flow 200 is further described. A user modified design 212, whether for updating the design, conducting experimental circuits, partially modifying a design, or some other purpose, is provided to bitstream generator 204.

Optionally, a check may be made at 315 to determine whether a user modified design 212, namely a request for configuration bitstream generation, is obtained via a network connection. Determining at 315 whether the request for a configuration bitstream generation is via a network may be used to thwart having multiple computers via separate network sessions requesting bitstream generation. Accordingly, if such a request is not from a network, then it may be determined at 301 whether DRC 205 is off, as previously described. If, however, it is determined at 315 that such request for configuration bitstream generation is from a network, then a check for violations with the output of DRC 205 off may be performed at 310 as described below in additional detail.

At 301, it is determined whether DRC 205 is turned off. If it is determined at 301 that DRC 205 is turned off, then at 310 a check for violations using DRC 205 is used, in spite of the fact that a user may think that DRC 205 is completely off. However, this check for violations at 310 using DRC 205 is with output of DRC 205 being off or disabled. From 310, flow 300 may proceed to 311 to determine whether a trip point has been tripped.

Determining whether DRC 205 is on or off at 301 may be optional. In other words, the threshold flag may be confined to whether force or some other unusual compilation setting is on or off as determined at 302. The option of turning off DRC may be omitted, and thus, operations at 301, 310, and 311 may be omitted. Furthermore, an optional check for network reverse engineering at 315 may be omitted as well. Thus, a user modified design 212 may be received, and if force is on, then at 312 a check for a trip point being tripped is made. However, it shall be assumed that operations 301, 310, and 311 are all present.

A check for violations with the output of DRC 205 is performed at 310. If there are no violations, then a configuration bitstream is generated at 333. If there are one or more violations, then it is determined whether the design checked for violations at 310 is a "degenerate design." The term "degenerate design," as used herein, generally means a design that is extremely sparse and may have one or more DRC violations. It should be appreciated that there are programmable blocks in programmable fabric, and thus if less than 20 percent of the total circuits of such programmable fabric are used, then a design may be classified as a degenerate design. Another type of degenerate design performs functions not connected to device inputs. Another type of degenerate design performs functions not used or connected to device outputs. Even though the example threshold of 20 percent is used, it should be appreciated that more or less than 20 percent of the total programmable resources of a PLD may be used. If the design is sparse and has one or more DRC violations, then a check at 312 is made to determine if a trip point has been tripped. If it is determined at 312 that a trip point has not been tripped, then deterrence information is updated at 313 and at 333 a bitstream is generated for the user modified design 212 to provide configuration bitstream 207. If, however, at 312 it is determined that a trip point has been tripped, then at least one reverse engineering countermeasure is initiated at 314.

An example of a reverse engineering countermeasure may be to slow bitstream generation. Thus, bitstream generation is allowed to progress at 333 but at a much slower rate with each trial after a trip point. Furthermore, with respect to slowing bit generation, such slowing may be progressively increased as the number of bit generation trials increases in excess of the trip point. At 313, the count may be incremented both to determine if a trip point has been violated and to progressively slow bitstream generation at 333 responsive to the size of such count, where as the count increases the amount of time for generating a configuration bitstream increases.

Another reverse engineering countermeasure that may be employed at 314 is to at least temporarily suspend bitstream generation. For example, an error message may be displayed with an error code that simply states that an error has occurred and to contact the manufacturer. If it is determined by someone at the manufacturer that the error has not been generated for the illegitimate purpose of reverse engineering the bitstream, then the manufacturer may reset a trip point counter. The trip point at 312 may be a threshold number of bit generation trials. This threshold number of bit generation trials may be limited to be within a time period. However, if the trip point has been exceeded in a reverse engineering violation of a license for use of bitstream generation software, then such software may remain disabled.

Updating deterrence information at 313 may include incrementing a count of the number of bit generation trials. A bitstream generator may be disabled for a time period after the trip point is tripped, and automatically reset, for example after 24 hours or some other period. In order to determine a rate of configuration bitstream generation, each configuration bitstream generated by a user may be time stamped. Alternatively, more than one reset by the manufacturer may be permitted up to some threshold number, and thus the number of resets may be incremented at 313. Thus, after the initiation of one or more reverse engineering countermeasures at 314, flow 300 may then proceed to updating deterrence information at 313.

Alternatively, updating deterrence information at 313 may include storing design information associated with the user design being a degenerate design. Such design information may be stored for purposes of comparison. With respect to updating deterrence information at 313, design information from a previous design may be stored. The previous design and the current design may be compared at 314 if a trip point has been reached. Storing information for sparse designs would not take nearly as much memory as attempting to store design information for full-chip designs. Accordingly, storing design information may be limited to degenerate designs. Thus, if a flag is set to indicate that a design is a degenerate design, design information may be stored to compare it against a prior degenerate design thereof. In this manner, it may be determined whether the designs are substantially the same or significantly different. Designs that are substantially the same except, for example, for one or two bits are likely to be illicit attempts to reverse engineer. If such a reverse engineering attempt is determined at 314, then bitstream generation may be stopped subject to be reset by the manufacturer as previously described.

At 311, it may be determined that the design is not a sparse design. Accordingly, such a design would not be considered a degenerate design, and bitstream generation may occur at 333. Tests 310 and 311 may be extended to include other design attributes that are considered suspicious or unusual.

If at 301 it is determined that DRC 205 is on, or has been set to be on for checking for DRC violations, then at 302 it may be determined whether forcing generation of a configuration bitstream is set to on at 302. If the forced condition is set at 302, then at 312 it is determined whether a trip point has been tripped, as previously described. Accordingly, it should be appreciated that operations 301 and 302 are effectively sensitivity flags for determining whether use of bitstream generator 204 is for illicit purposes.

If, however, it is determined at 302 that the forced condition is set to off, then at 303 a check for violations is performed by DRC 205 with the output of DRC 205 on. At 304, it is determined if there are any violations in the user modified design 212 checked at 303. If there are no violations, then bitstream generation occurs at 333 for outputting a configuration bitstream 207. If there are one or more violations identified at 303, then an error report is generated at 305 and such error report 306 may be output. The branch of flow 300 associated with operations 303 through 305 is conventional, and thus not described in unnecessary detail for purposes of clarity. Tests 301 and 302 may be extended to include other program settings that are considered suspicious or unusual.

Accordingly, it should be appreciated that lawful uses, such as updating a design, experimenting, and partial reconfiguration, may pass for generating a configuration bitstream 207 where deterring reverse engineering is transparent to the user. In other words, unless a user trips a trip point, they may have no knowledge of being detected as a possible reverse engineer. On the other hand, because reverse engineering as previously described will involve tens of thousands of comparisons, setting trip point to a reasonable threshold will allow for lawful uses while clearly being tripped for illicit uses. Thus, a reasonable number for a trip point may be 50 or less trials per day, or some other number.

Figure 4:
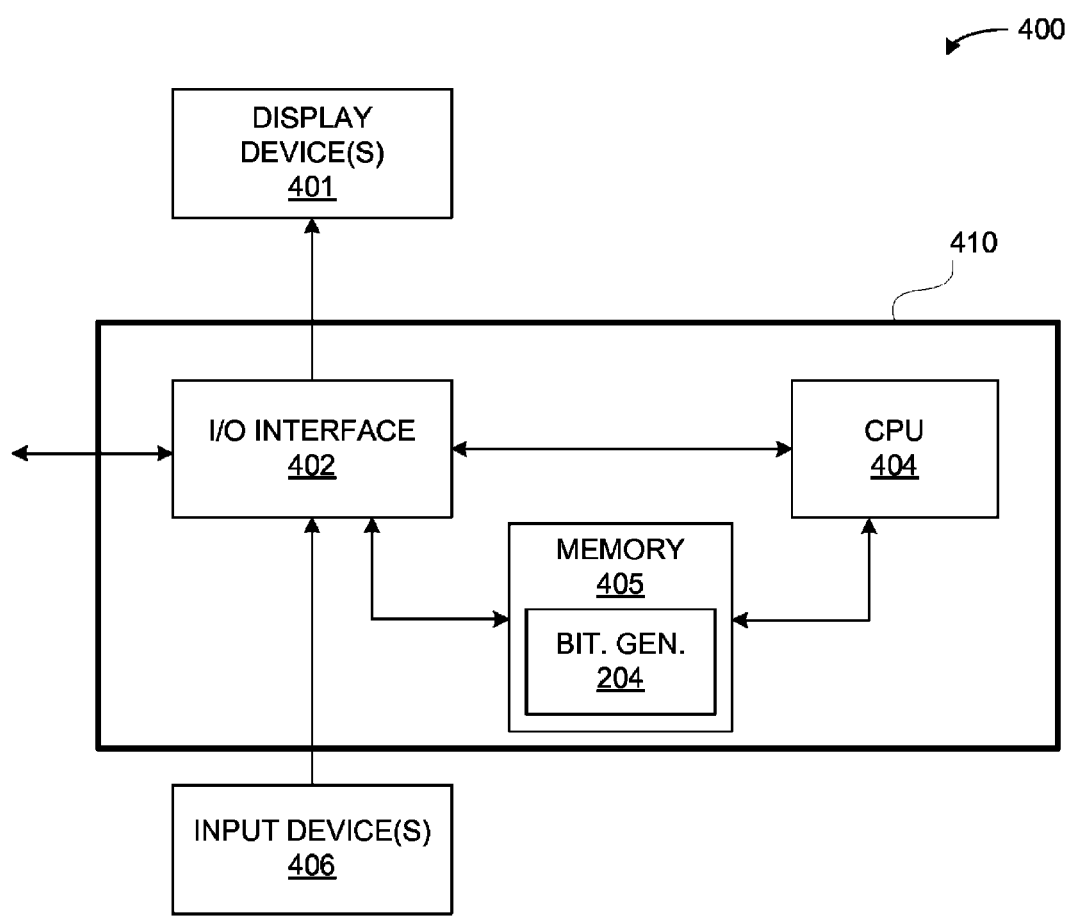
FIG. 4 is a high-level block diagram of an exemplary embodiment of a computer system.

FIG. 4 is a high-level block diagram of an exemplary embodiment of a computer system 400. Computer system 400 may include a programmed computer 410 coupled to one or more display devices 401, such as Cathode Ray Tube ("CRT") displays, Plasma displays, Liquid Crystal Displays ("LCD"), and to one or more input devices 406, such as a keyboard and a cursor pointing device. Other known configurations of a computer system may be used.

Programmed computer 410 may be programmed with a known operating system, which may be Mac OS, Java Virtual Machine, Linux, Solaris, Unix, or a Windows operating system, among other known platforms. Programmed computer 401 includes a central processing unit (CPU) 404, memory 405, and an input/output ("I/O") interface 402. CPU 404 may be a type of microprocessor known in the art, such as available from IBM, Intel, and Advanced Micro Devices for example. Support circuits (not shown) may include conventional cache, power supplies, clock circuits, data registers, and the like. Memory 405 may be directly coupled to CPU 404 or coupled through I/O interface 402. At least a portion of an operating system may be disposed in memory 405. Memory 405 may include one or more of the following: random access memory, read only memory, magneto-resistive read/write memory, optical read/write memory, cache memory, magnetic read/write memory, and the like, as well as signal-bearing media as described below.

I/O interface 402 may include chip set chips, graphics processors, and daughter cards, among other known circuits. An example of a daughter card may include a network interface card ("NIC"), a display interface card, a modem card, and a Universal Serial Bus ("USB") interface card, among other known circuits. Thus, I/O interface 402 may be coupled to a conventional keyboard, network, mouse, display printer, and interface circuitry adapted to receive and transmit data, such as data files and the like. Notably, programmed computer 410 may be coupled to a number of client computers, server computers, or any combination thereof via a conventional network infrastructure, such as a company's Intranet and/or the Internet, for example, allowing distributed use for interface generation.

Memory 405 may store all or portions of one or more programs or data to implement processes in accordance with one or more aspects of the invention to provide compiler or bitstream generator ("program product") 204 having a reverse engineering deterrence module 206 of FIG. 2 as previously described. Additionally, those skilled in the art will appreciate that one or more aspects of the invention may be implemented in hardware, software, or a combination of hardware and software. Such implementations may include a number of processors independently executing various programs and dedicated hardware or programmable hardware.

One or more program(s) of the program product 204, as well as documents thereof, may define functions of embodiments in accordance with one or more aspects of the invention and can be contained on a variety of signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Furthermore, such signal-bearing media may be in the form of a carrier wave or other signal propagation medium via a communication link for streaming information, including downloading all or a portion of a computer program product. Such signal-bearing media, when carrying computer-readable instructions that direct functions of one or more aspects of the invention, represent embodiments of the invention.

While the foregoing describes embodiments directed toward PLDs, those of ordinary skill in the art will observe that these can be applied to compilation for other devices. For example, these embodiments can be applied to software compilation for microprocessors, microcontrollers, graphics processors and other processing devices. Compilation can include just-in-time compilation as well as operation of an interpreter in scripting languages. The "design" includes any functionality or instruction to be executed by interpreted software. Thus, these embodiments can be applied to protecting software in other settings as well. For example data base search software may detect degenerate queries and identify unusual parameter settings in order to deter attempts to extract information on a single individual from a database intended to only divulge aggregate information. A word processor may detect degenerate documents and checks that are intended to extract the contents of its dictionary or thesaurus. These applications may not have a force setting or DRC failure.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for deterring reverse engineering, comprising:
   obtaining a user design;
   determining if the user design is a degenerate design;
   in response to determining that the user design is a degenerate design, determining, by a processor, if a compilation count violates a trip point for compilations;
   in response to determining that the compilation count does not violate the trip point, updating deterrence information, allowing compilation to take place, and updating the compilation count; and
   in response to determining that the compilation count violates the trip point for the compilation, initiating at least one reverse engineering countermeasure.

2. The method according to claim 1, wherein the at least one reverse engineering countermeasure is to slow the compilation.

3. The method according to claim 1, wherein the at least one reverse engineering countermeasure is to at least temporarily suspend the compilation.

4. The method according to claim 3, wherein the at least one reverse engineering countermeasure includes outputting an error message.

5. The method according to claim 4, wherein the error message includes an error code for contacting a manufacturer of a programmable logic device associated with the compilation.

6. The method according to claim 1, wherein the trip point is a threshold number of compilation trials.

7. The method according to claim 6, wherein the trip point is the threshold number of compilation trials within a time period.

8. The method according to claim 7, wherein the updating of the deterrence information includes incrementing a count of the compilation trials.

9. The method according to claim 7, wherein the at least one reverse engineering countermeasure is to progressively slow the compilation for the compilation trials in excess of the trip point.

10. The method according to claim 1, further comprising determining if at least one sensitivity flag is set.

11. The method according to claim 10, wherein the at least one sensitivity flag is having design rule checking turned off.

12. The method according to claim 10, wherein the at least one sensitivity flag is having a force setting for the compilation turned on.

13. The method according to claim 10, wherein the at least one sensitivity flag is having a request for the compilation being via a network connection.

14. The method according to claim 1, wherein compilation comprises bitstream generation.

15. The method according to claim 1, wherein the updating of the deterrence information includes storing design information associated with the user design being the degenerate design.

16. A method for deterring reverse engineering, comprising:
   obtaining user data;
   checking for an unusual compilation setting being active;
   the unusual compilation setting causing output data to be generated regardless of any error in the user data;
   if the force setting is active,
      determining, by a processor, if a compilation counter violates a trip point for generation of the output data;
      in response to determining that the compilation counter does not violate the trip point for generation of the output data, allowing generation of the output data and updating the compilation counter; and
      in response to determining that the compilation counter violates the trip point for generation of the output data, initiating at least one reverse engineering countermeasure.

17. The method according to claim 16, wherein the output data is a configuration bitstream for field programmable logic gates; and the at least one reverse engineering countermeasure is to at least temporarily suspend generation of the bitstream.

18. The method according to claim 16, wherein the trip point is a threshold number of generation trials of the output data within a time period.

19. The method according to claim 16, wherein the at least one reverse engineering countermeasure includes the updating of the counter and progressively slowing generation of the output data for generation trials in excess of the trip point.

20. A non-transitory machine-readable medium having stored thereon information representing instructions that, when executed by a processor, cause the processor to perform operations comprising:
- obtaining user data;
- checking for an unusual compilation setting being active, the unusual compilation setting causing output data to be generated regardless of any error in the user data;
- if the unusual compilation setting is active,
  - determining if a compilation counter violates a trip point for generation of the output data;
  - in response to determining that the compilation counter does not violate the trip point for generation of the output data, allowing generation of the output data and updating the compilation counter; and
  - in response to determining that the compilation counter violates the trip point for generation of the output data, initiating one or more reverse engineering countermeasures.

21. The machine-readable medium according to claim 19, wherein the one or more reverse engineering countermeasures include outputting an error message and at least temporarily suspending the output data generation; and wherein the trip point is a threshold number of generation trials of the output data within a time period.

* * * * *